United States Patent
Sayegh

(10) Patent No.: US 11,467,220 B2
(45) Date of Patent: Oct. 11, 2022

(54) METHOD AND DEVICE FOR DETERMINING A MAXIMUM DURATION OF USE OF A BATTERY

(71) Applicant: SAFRAN ELECTRICAL & POWER, Blagnac (FR)

(72) Inventor: Marie Sayegh, Moissy-Cramayel (FR)

(73) Assignee: SAFRAN ELECTRICAL & POWER, Blagnac (FR)

(*) Notice: Subject to any disclaimer, the term of this patent is extended or adjusted under 35 U.S.C. 154(b) by 3 days.

(21) Appl. No.: 17/260,885

(22) PCT Filed: Jul. 16, 2019

(86) PCT No.: PCT/FR2019/051784
§ 371 (c)(1),
(2) Date: Jan. 15, 2021

(87) PCT Pub. No.: WO2020/016522
PCT Pub. Date: Jan. 23, 2020

(65) Prior Publication Data
US 2021/0263105 A1    Aug. 26, 2021

(30) Foreign Application Priority Data
Jul. 17, 2018 (FR) ........................... 1856605

(51) Int. Cl.
*G01R 31/389* (2019.01)
*G01R 31/392* (2019.01)
(Continued)

(52) U.S. Cl.
CPC ......... *G01R 31/389* (2019.01); *G01R 31/367* (2019.01); *G01R 31/374* (2019.01);
(Continued)

(58) Field of Classification Search
None
See application file for complete search history.

(56) References Cited

U.S. PATENT DOCUMENTS

| 2016/0259013 | A1* | 9/2016 | Basu ............... G01R 31/392 |
| 2016/0259014 | A1 | 9/2016 | Adagouda et al. |
| 2016/0349330 | A1 | 12/2016 | Barfield et al. |

FOREIGN PATENT DOCUMENTS

| EP | 2933149 A | 10/2015 |
| WO | 2005/003800 A1 | 1/2005 |

OTHER PUBLICATIONS

International Search Report and Written Opinion dated Oct. 25, 2019, in international application No. PCT/FR2019/051784, filed Jul. 16, 2019, 12 pages.

* cited by examiner

*Primary Examiner* — Jas A Sanghera
(74) *Attorney, Agent, or Firm* — Christensen O'Connor Johnson Kindness PLLC

(57) ABSTRACT

Methods for determining a maximum duration of use of a battery, include: selecting a period of use of the battery; obtaining values of factors of degradation of the battery during the period of use of the battery selected during the selection step; determining at least one indicator of ageing of the battery on the basis of the degradation factor values obtained in the step of obtaining said values; and identifying intervals of variation of the degradation factors during said period of use, each ageing indicator being associated with actual variation intervals which each have a minimum value and a maximum value of said factors used during the determination step; and a step of predicting the maximum duration of use on the basis of the variation intervals obtained in the step of identification, the at least one ageing indicator and the operating limits of the battery.

10 Claims, 2 Drawing Sheets

Figure 1:
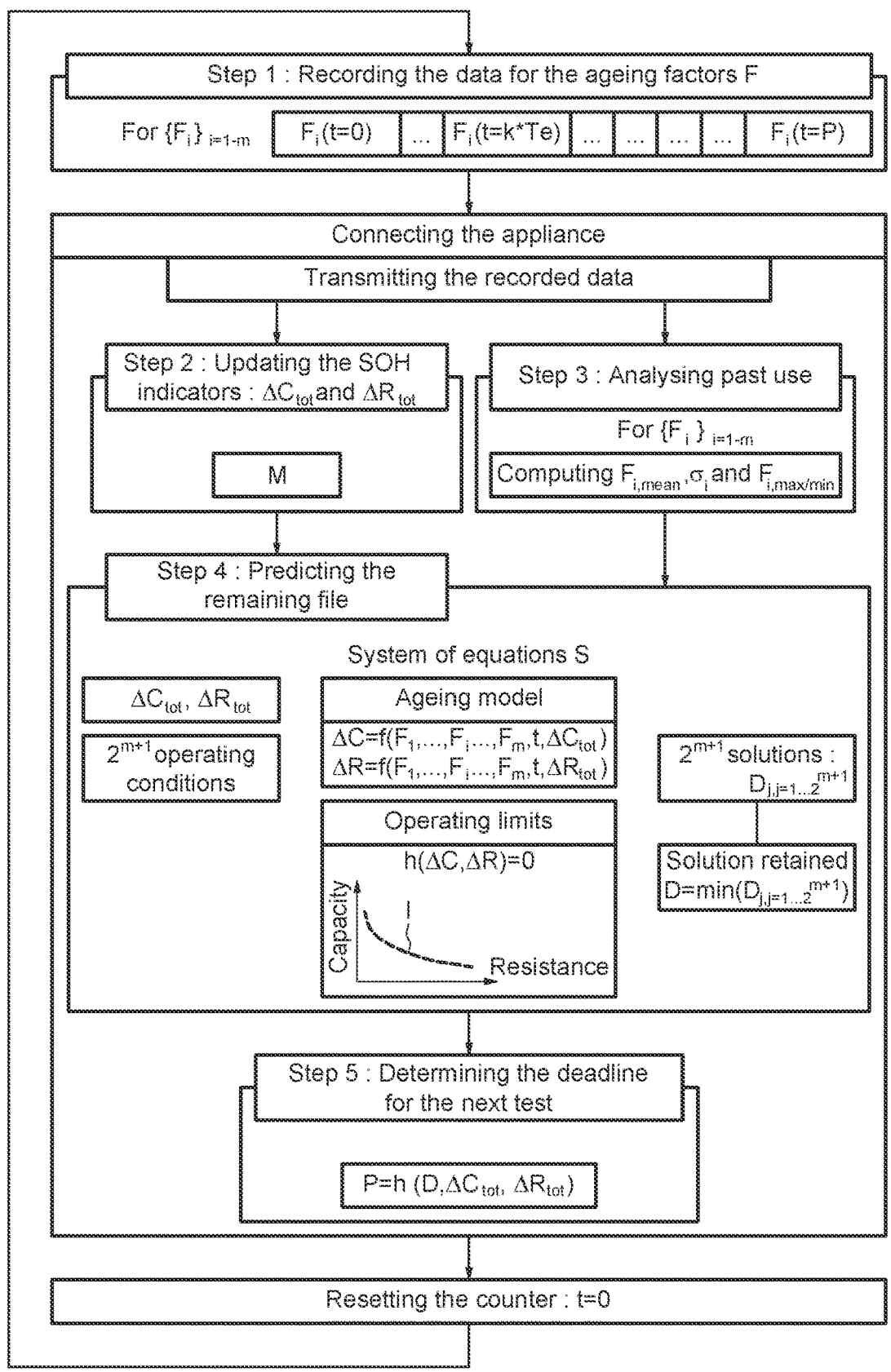

(51) Int. Cl.
*G01R 31/3835* (2019.01)
*G01R 31/367* (2019.01)
*G01R 31/374* (2019.01)
*H01M 10/42* (2006.01)

(52) U.S. Cl.
CPC ....... *G01R 31/3835* (2019.01); *G01R 31/392* (2019.01); *H01M 10/4285* (2013.01)

METHOD AND DEVICE FOR DETERMINING A MAXIMUM DURATION OF USE OF A BATTERY

The present invention relates, as a whole, to the monitoring of the operating state of batteries of electric accumulators and, in particular, to the monitoring of the operating state of batteries on board an aircraft.

More particularly, the invention relates to the monitoring of the remaining life of a battery by predicting a maximum duration of use of the battery, in particular as regards one or more usage profiles of the battery. This in particular concerns predicting the time at which the battery must undergo a maintenance action.

A certain number of parameters are capable of influencing the remaining life of a battery.

For example, when the temperature of the battery drops, the available capacity, i.e. the capacity that it is capable of exchanging with a load, falls. Similarly, the value of the internal resistance increases as the temperature falls, causing a consecutive drop in the output voltage.

Battery ageing can also be the result of conditions of use of the battery, as well as the storage conditions thereof.

The estimation of the maximum duration of use of a battery allows the maintenance phases of the battery to be optimised and thus prevents any potential future failure.

More specifically, batteries are routinely maintained, and occasionally dismantled at less frequent intervals, in particular to conduct series of tests on a test bench.

Human intervention is unavoidable in most cases for this type of operation, especially in the case of opening the battery to adjust the electrolyte density or level, for lead-acid/NiCd batteries for example.

The increasingly common integration of new technologies in batteries, such as lithium-ion based technology, limits maintenance needs. However, the maintenance intervals must still be optimised to reduce human intervention in the battery maintenance process as far as possible and avoid the need to dismantle the battery or temporarily interrupt service.

Battery testing is essentially based on estimating the state of health (SOH) of the battery and the remaining life thereof.

However, the remaining life of a battery is difficult to predict. More specifically, for numerous applications, the remaining life of a battery is generally determined in numbers of cycles. However, this formulation is not compatible with the more complex applications wherein the battery is subjected to varied operating conditions both as regards battery storage mode and the operation thereof, since these conditions are unforeseeable and non-recurring.

Methods are already known in the prior art for determining the remaining life of a battery, the life being provided as a function of the number of cycles of use, updated by counting down.

Reference can be made to the European patent document EP-A-2 933 149 wherein the parameters of a rechargeable battery are determined during multiple charging and discharging cycles, these parameters allowing the remaining life of the battery and the performance levels thereof to be indicated. At the end of these charging and discharging phases, a remaining capacity and an internal resistance are in particular estimated based on the current, the voltage and the temperature of the battery.

Reference can also be made to the international patent document WO 2005/00 38 00 wherein a state of health SOH indicator for the battery is generated using a function that is adaptively implemented during battery tests, with the remaining life being estimated based on the SOH indicators using a life model for the battery.

The purpose of the invention is thus to overcome the various drawbacks of the prior art and allow a maximum duration of use of a battery to be determined, which maximum duration of use is sufficiently reliable and accurate to extend the maintenance periods, i.e. the duration between two consecutive maintenance actions. The invention thus relates to a method for determining a maximum duration of use of a battery, which includes:
  a step of selecting a period of use of the battery;
  a step of obtaining values of degradation factors of the battery during the period of use of the battery selected during the selection step;
  a step of determining one or more indicators of ageing of the battery on the basis of the degradation factor values obtained during the obtaining step;
  a step of identifying intervals of variation of the degradation factors during said period of use, each ageing indicator being associated with actual intervals of variation which each comprise a minimum value and a maximum value of said factors used during the determination step; and
  a step of predicting the maximum duration of use on the basis of the intervals of variation obtained in the identification step, the one or more ageing indicators and the operating limits of the battery.

Thus, the maximum duration of use of the battery is founded on an analysis of the operation of the battery during a predetermined period of use and on a prediction of the maximum duration of use generated, in particular, based on a predictive model combined with operating limit values for the battery which allow it to be determined whether the operating conditions derived from the intervals of variation of the degradation factors are located outside of the operating limits and thus allow for an accurate and reliable estimation of the maximum duration of use of the battery.

In one method of implementing the invention, the intervals of variation of the degradation factors are identified on the basis of a computation of the mean and standard deviation values of the degradation factors, the values of the degradation factors being obtained during the period of use P.

Advantageously, the ageing indicators are obtained on the basis of an ageing model for the battery as a function of the degradation factors.

In one method of implementing the invention, the method comprises an additional battery prior training step, during which the operating limits of the battery are determined as a function of the degradation factors.

Preferably, the step of predicting the maximum duration of use further comprises a phase of analysing the operating conditions using the minimum and maximum values of each degradation factor and the operating limits of the battery. According to another feature of the method, an ageing model is used, which model receives, at the input, $2^{m+1}$ limit values of m degradation factors, and generates $2^{m+1}$ maximum duration of use values, and a minimum value of the maximum durations generated is retained.

For example, the ageing indicators comprise the value of the internal resistance of the battery and of the capacity of the battery.

The degradation factors can comprise the temperature of the battery, the state of charge of the battery and the number of battery solicitation cycles.

Advantageously, the battery degradation factors are weighted.

The invention further relates to a device for determining a maximum duration of use of a battery, comprising:

an ageing model for the battery capable of generating ageing indicator values as a function of degradation factors of the battery obtained during a period of use of the battery; and computation means for computing minimum and maximum values of the degradation factors influencing the ageing indicators;

the ageing model generating a maximum duration of use of the battery, for each operating condition corresponding to a combination of the minimum and maximum values of the degradation factors, and on the basis of the operating limits of the battery, the computation means being adapted to retain the minimum value of the maximum durations of use.

Figure 2:
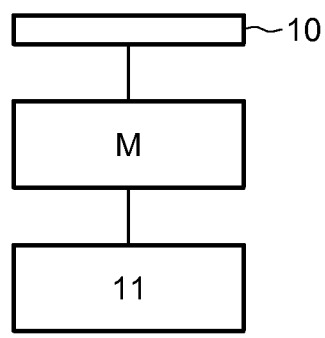

Other purposes, features and advantages of the invention will appear after reading the following description, which is provided for purposes of illustration only and not intended to limit the scope of the invention, given with reference to the accompanying drawings, wherein:

FIG. 1 is a block diagram showing the main phases of a method for determining a maximum duration of use of a battery according to the invention; and FIG. 2 shows the general architecture of a corresponding device for determining the maximum duration of use of a battery.

The method shown in FIG. 1 aims to estimate the remaining life of a battery, in particular of a rechargeable battery of electric accumulators on board an aircraft.

It more particularly aims to estimate the maximum duration of use of a battery, taking into account degradation factors capable of influencing the life of the battery.

This method is intended to predict the time at which the battery will no longer be able to perform its power supply function during use thereof under predetermined conditions of use.

It thus allows maintenance phases to be scheduled on the basis of a prediction of the remaining life of the battery.

In one method of implementing the invention, this method is implemented within a device which is connected to the battery and communicates therewith, this device incorporating all hardware and software means for implementing this method. Such a device in particular uses a predictive model of the battery capable of predicting the remaining life of the battery, of predicting the possible conditions of future use thereof and of updating the state of health SOH indicators thereof on the basis of an analysis of the past use of the battery during a period P of use.

For the purposes of illustration, the remaining life is considered to be predicted with the assumption that the conditions of use of the battery during the period P of use are reproduced during subsequent phases of battery use.

However, the scope of the invention also includes the case where the future conditions of battery use are modified, the method being capable of predicting these conditions of use.

As shown in FIG. 1, the method comprises a first recording step 1, during which a number m of degradation factors of the battery is identified for the current usage profile of the battery. These factors $F_{i, i=1, \ldots, m}$ are recorded for a period P of use separating two battery testing events, subsequently updated.

The sampling of the records depends on the application, i.e. on the mode of use of the battery. For example, this sampling is carried out per unit of time (number of hours, number of days, etc.) or per number of events (charging and discharging cycles, etc.).

As shown, these recordings are taken periodically according to a period $T_e$, a degradation factor $F_i$ being recorded at a time $k \times T_e$, where $k=1, \ldots, n$, and $P = n \times T_e$.

When the testing device is connected to the battery, the data recording step 1 ends. The data stored in memory in the battery are thus transmitted to the device.

During the subsequent step 2, the state of health SOH of the battery is determined or updated. The state of health is, in this case, represented by two ageing indicators $\Delta C$ and $\Delta R$ respectively denoting the evolutions in the capacity and the internal resistance of the battery.

For this purpose, the testing device is provided with an ageing model M capable of generating indicator values $\Delta C$ and $\Delta R$ on the basis of the recorded data received at the input. Step 3 constitutes a step of analysing the past use of the battery during the period P of use. The weighted mean $F_{i,mean}$ and standard deviation $\sigma_i$ of the values of each degradation factor $F_i$ are computed. The weighting of the means and standard deviations is determined using the ageing model. The model is used to determine the ranges of variation of each factor $F_i$ that most affect battery degradation. More specifically, the influence of the factors $F_i$ is assumed to be different as the capacity and the internal resistance of the battery evolve.

During this step 3, sets of means $F_{i,mean}$ and of standard deviations $\sigma_i$ are determined and weights extracted from a mapping are assigned to the means and standard deviations computed for each indicator.

During this step, intervals of variation of the ageing factors corresponding to intervals of influence $[F_{i,min}, F_{i,max}]$ in the period P are identified for each of the indicators according to the equation:

$$F_{i,max/min} = F_{i,mean} \pm \sigma_i \qquad (1)$$

By assuming that the future operating conditions are similar to those observed during the period P, the limits $F_{i,max/min}$ are used in the following steps of the method to predict the remaining life of the battery.

During the next step 4, the remaining life of the battery is predicted on the basis of the intervals of variation of the degradation factors and operating limits of the battery obtained by prior training as a function of ageing indicator values.

In the example implementation envisaged, the operating limits of the battery are obtained by prior training during a battery test phase as a function of the ageing indicators $\Delta C$ and $\Delta R$.

As shown in FIG. 1, the operating limits of the battery are identified by an end-of-life curve I determined as a function of battery usage profiles. These tests are carried out for each usage profile and consist of checking whether the battery is capable of providing the usage profile requested thereof, in terms of voltage level, current level, power or electrical energy, for a predefined duration or ranges of durations, for various internal capacity and resistance values of the battery.

The combination of the limits $F_{i,max/min}$ of the m degradation factors gives, for each SOH indicator, $2^m$ operating conditions expressed as follows:

$$\{F1,k, \ldots, Fi,k, \ldots, Fm,k\} = [\max, \min] \qquad (2)$$

In total, $2^{m+1}$ combinations are identified for the ageing model. The resolution of the system of equations S for these $2^{m+1}$ inputs gives, at the output, $2^{m+1}$ remaining life values D for the battery. The minimum value from among the results is retained.

During the next step 5, the deadline proposed for the next test P' on the battery is determined. This deadline is determined on the basis of a function h which depends on the estimated remaining life D and the ageing indicators of the battery. For example, the deadline proposed for the next test P' is defined as half the remaining life D. In this way, for example, the proposed deadline P' is not equal to the battery monitoring deadline P. More specifically, the period between two tests can exceed the deadline considered according to the maintenance management mode of the battery. At the end of this step 5, the timer is reset and a new period P is started. The testing device is then disconnected.

As indicated hereinabove, the method described above is advantageously implemented by a testing device which is connected to a battery to retrieve and analyse the data stored in memory during the period P of use of the battery. This device retrieves the data on the degradation factors stored in memory in the battery and updates the state of health of the battery, predicts the remaining life thereof and computes a deadline for the next test. In this respect, for example, a maintenance action can be considered to be required in a time interval comprised between a minimum value $T_{min}$ and a maximum value $T_{max}$.

With reference to FIG. 2, the device includes an interface 10 for electrical connection to the battery, an ageing model M capable of generating ageing indicator values as a function of the degradation factors and computing means 11 for implementing the steps described hereinabove with reference to FIG. 1, and in particular steps 3 to 5 to compute the minimum and maximum values of the degradation factors that influence the ageing indicators and solve the system of equations S of the $2^{m+1}$ combinations identified for the ageing model and generate, at the output, the $2^{m+1}$ values of the remaining life of the battery to extract the minimum value therefrom and determine the deadline for the next test.

One example implementation of the invention, which corresponds to the case of the ageing of a battery in storage mode will now be described. In such a case, only the calendar ageing influences the life of the battery, as a function of the ambient temperature and the state of charge SOC of the battery. The state of charge is directly obtained from the open-circuit voltage OCV obtained at the terminals of the battery. The degradation factors identified in such a case are the temperature and the state of charge of the battery. The recordings of the ambient temperature and of the voltage of the battery respectively represent these two degradation factors. The sampling of the degradation factors is chosen according to the battery's environment. For example, the measurements are taken once a day. Moreover, the temperature degradation factor has the largest impact. The largest weights are thus assigned to the highest temperatures when computing the weighted means and standard deviations.

When charging and discharging the battery, a plurality of additional factors exists. These include the current and a parameter referred to as the depth of discharge or DoD. Other factors can also exist. These factors can be quantified as a quantity of amperes exchanged, a number of cycles and of solicitations, etc. as a function of the target application and knowledge of the future usage profiles of the battery. Calendar ageing is predominant. The contribution of degradation from other causes can be taken into account for information purposes. The method can thus be applied, regardless of the application considered.

The invention claimed is:

1. A method for determining a maximum duration of use of a battery, comprising:
   selecting a period of use of the battery;
   obtaining values of degradation factors of the battery during the period of use;
   determining one or more ageing indicators of the battery based upon the values of degradation factors;
   identifying intervals of variation of the values of degradation factors during said period of use, each of the one or more ageing indicators being associated with actual intervals of variation which each comprise a minimum value and a maximum value of said degradation factors; and
   predicting the maximum duration of use based upon the intervals of variation, the one or more ageing indicators, and at least one operating limit of the battery.

2. The method according to claim 1, wherein the intervals of variation of the degradation factors are identified based upon a computation of a mean and a standard deviation of the values of the degradation factors.

3. The method according to claim 1, wherein the ageing indicators are obtained based upon an ageing model for the battery as a function of the degradation factors.

4. The method according to claim 1, further comprising determining the at least one operating limit of the battery as a function of the degradation factors.

5. The method according to claim 4, wherein predicting the maximum duration of use comprises analysing operating conditions using minimum and maximum values of each degradation factor and of the at least one operating limit of the battery.

6. The method according to claim 5, wherein predicting the maximum duration of use comprises using an ageing model which receives, at an input, $2^{m+1}$ limit values of m degradation factors, and generates $2^{m+1}$ maximum duration of use values, and wherein a minimum value of the maximum duration of use values generated is retained.

7. The method according to claim 1, wherein the one or more ageing indicators comprise an internal resistance of the battery and a capacity of the battery.

8. The method according to claim 1, wherein the degradation factors comprise a temperature of the battery, a state of charge of the battery, and a number of battery solicitation cycles.

9. The method according to claim 1, wherein the battery degradation factors are weighted.

10. A device for determining a maximum duration of use of a battery, comprising:
    an ageing model for the battery capable of generating ageing indicator values as a function of degradation factors obtained during a period of use of the battery; and
    a computer configured to compute minimum and maximum values of the degradation factors,
    wherein the ageing model generates a maximum duration of use of the battery, for each operating condition corresponding to a combination of the minimum and maximum values of the degradation factors, and based upon at least one operating limit of the battery,
    wherein the computer is adapted to retain the minimum value of the generated maximum durations of use.

* * * * *